United States Patent
Nagatomi et al.

(10) Patent No.: US 10,707,074 B2
(45) Date of Patent: Jul. 7, 2020

(54) METHOD FOR MANUFACTURING SEMICONDUCTOR DEVICE, NON-TRANSITORY COMPUTER-READABLE RECORDING MEDIUM, AND SUBSTRATE PROCESSING APPARATUS

(71) Applicant: HITACHI KOKUSAI ELECTRIC INC., Tokyo (JP)

(72) Inventors: Yoshimasa Nagatomi, Toyama (JP); Hirohisa Yamazaki, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 15 days.

(21) Appl. No.: 15/933,104

(22) Filed: Mar. 22, 2018

(65) Prior Publication Data
US 2018/0286662 A1  Oct. 4, 2018

(30) Foreign Application Priority Data
Mar. 28, 2017 (JP) ................................ 2017-062545

(51) Int. Cl.
| H01L 21/02 | (2006.01) |
| H01L 21/673 | (2006.01) |
| C23C 16/52 | (2006.01) |
| C23C 16/44 | (2006.01) |
| C23C 16/455 | (2006.01) |

(Continued)

(52) U.S. Cl.
CPC ........ *H01L 21/0228* (2013.01); *C23C 16/405* (2013.01); *C23C 16/4412* (2013.01); *C23C 16/45527* (2013.01); *C23C 16/45563* (2013.01); *C23C 16/45578* (2013.01); *C23C 16/52* (2013.01); *H01L 21/02181* (2013.01);

(Continued)

(58) Field of Classification Search
None
See application file for complete search history.

(56) References Cited

U.S. PATENT DOCUMENTS 9,340,873 B2 *  5/2016  Saito ................. C23C 16/45534
9,401,282 B2 *  7/2016  Yamazaki ............. H01L 21/306
(Continued)

FOREIGN PATENT DOCUMENTS

| CN | 103966576 A | 8/2014 |
| JP | 59-061920 A | 4/1984 |

(Continued)

OTHER PUBLICATIONS

English translation of WO2015140933, 36 pp, retrieved from internet on Nov. 18, 2019 from http://translationportal.epo.org/emtp/translate/?ACTION=description-retrieval&COUNTRY=WO&ENGINE=google&FORMAT=docdb&KIND=A1&LOCALE=en_EP&NUMBER=2015140933&OPS=ops.epo.org/3.2&SRCLANG=ja&TRGLANG=en.*

(Continued)

*Primary Examiner* — David E Graybill
(74) *Attorney, Agent, or Firm* — Volpe and Koenig, P.C.

(57) ABSTRACT

By sequentially performing, a plurality of times, a step of supplying a mixed gas of an organic metal-containing source gas and an inert gas to a process chamber housing a substrate by adjusting a flow velocity of the mixed gas on the substrate to 7.8 m/s to 15.6 m/s and adjusting a partial pressure of the organic metal-containing source gas in the mixed gas to 0.167 to 0.3, a step of exhausting the process chamber, a step of supplying an oxygen-containing gas to the process chamber, and a step of exhausting the process chamber, a metal oxide film is formed on the substrate.

5 Claims, 10 Drawing Sheets

(51) Int. Cl.
*C23C 16/40* (2006.01)
*H01L 27/108* (2006.01)

(52) U.S. Cl.
CPC .. *H01L 21/02189* (2013.01); *H01L 21/67303* (2013.01); *H01L 27/1085* (2013.01)

(56) References Cited

U.S. PATENT DOCUMENTS

| | | | | |
|---|---|---|---|---|
| 2008/0166886 A1* | 7/2008 | Sakai | ................ | C23C 16/45546 438/778 |
| 2009/0071505 A1* | 3/2009 | Miya | ................ | B08B 7/0035 134/1.1 |
| 2009/0130860 A1* | 5/2009 | Miya | ................ | C23C 16/4405 438/778 |
| 2009/0197424 A1* | 8/2009 | Sakai | ................ | C23C 16/405 438/758 |
| 2010/0186774 A1* | 7/2010 | Miya | ................ | B08B 7/0035 134/22.1 |
| 2011/0024875 A1* | 2/2011 | Takebayashi | ........... | C23C 16/40 257/532 |
| 2011/0130011 A1* | 6/2011 | Sasajima | ................ | C23C 16/402 438/770 |
| 2013/0095668 A1* | 4/2013 | Saito | ................ | C23C 16/45534 438/758 |
| 2013/0260566 A1* | 10/2013 | Yamazaki | ............. | H01L 21/306 438/706 |
| 2013/0267100 A1* | 10/2013 | Takagi | ................ | C23C 16/4485 438/758 |
| 2013/0309876 A1* | 11/2013 | Ogawa | ................ | C23C 16/08 438/758 |
| 2014/0182515 A1* | 7/2014 | Yamazaki | ........... | C23C 16/4481 118/722 |
| 2014/0213069 A1* | 7/2014 | Takebayashi | ..... | H01L 21/67109 438/770 |
| 2014/0295667 A1* | 10/2014 | Kaga | ................ | C23C 16/34 438/680 |
| 2015/0093911 A1* | 4/2015 | Nakatani | ................ | C23C 16/52 438/761 |
| 2015/0214045 A1* | 7/2015 | Saito | ................ | C23C 16/45534 438/785 |
| 2016/0042940 A1* | 2/2016 | Nakatani | ................ | C23C 16/52 438/761 |
| 2017/0004961 A1* | 1/2017 | Ushida | ............. | H01L 21/02186 |
| 2017/0092490 A1* | 3/2017 | Yamazaki | ......... | H01L 21/02186 |
| 2018/0095480 A1* | 4/2018 | Bauer | ................ | G05D 7/0635 |
| 2018/0135176 A1* | 5/2018 | Morikawa | ............ | C23C 16/405 |
| 2018/0286662 A1* | 10/2018 | Nagatomi | ........... | H01L 21/0228 |
| 2018/0286725 A1* | 10/2018 | Nonomura | ......... | H01L 21/0228 |
| 2019/0093222 A1* | 3/2019 | Okuda | ............. | H01L 21/67017 |

FOREIGN PATENT DOCUMENTS

| | | |
|---|---|---|
| JP | 2014-127702 A | 7/2014 |
| WO | 2015/140933 A1 | 9/2015 |

OTHER PUBLICATIONS

Japanese Office Action dated Jul. 23, 2019 for the Japanese Patent Application No. 2017-062545.

* cited by examiner

METHOD FOR MANUFACTURING SEMICONDUCTOR DEVICE, NON-TRANSITORY COMPUTER-READABLE RECORDING MEDIUM, AND SUBSTRATE PROCESSING APPARATUS

CROSS-REFERENCE TO RELATED PATENT APPLICATION

This non-provisional U.S. patent application claims priority under 35 U.S.C. § 119 of Japanese Patent Application No. 2017-062545, filed on Mar. 28, 2017, the entire contents of which are hereby incorporated by reference.

BACKGROUND

Technical Field

This present disclosure relates to a method for manufacturing a semiconductor device, a non-transitory computer-readable recording medium, and a substrate processing apparatus.

Related Art

A high dielectric constant film (High-k film) is sometimes used as a capacitor insulating film of a DRAM. For example, as one step in a process of manufacturing a semiconductor device (device), there is a technique of alternately supplying a source gas and an oxidizing gas to form an insulating film on a substrate (for example, refer to JP 2014-168046 A).

In recent years, by reduction of a cell area due to device miniaturization, an aspect ratio has been increased in order to secure a capacitor capacity, and it has become necessary to improve step coverage performance such as film formation in a deeper groove. In order to improve step coverage performance, it is necessary to sufficiently supply a gas to a lower portion of a device. However, if it is tried to sufficiently supply a gas to the lower portion of the device due to an increase in the aspect ratio, a processing gas is supplied excessively to an upper portion of the device, and step coverage performance is not be improved. In order to improve step coverage performance, it is necessary to suppress the amount of a processing gas supplied to the upper portion of the device while a gas is sufficiently supplied to the lower portion of the device.

SUMMARY

According to one aspect of this present disclosure, it is intended to improve step coverage performance of a film formed on a substrate.

According to one embodiment of this present disclosure, a technique is provided in which a metal oxide film is formed on a substrate by sequentially performing, a plurality of times, a step of supplying a mixed gas of an organic metal-containing source gas and an inert gas to a process chamber housing the substrate by adjusting a flow velocity of the mixed gas on the substrate to 7.8 m/s to 15.6 m/s and adjusting a partial pressure of the organic metal-containing source gas in the mixed gas to 0.167 to 0.3, a step of exhausting the process chamber, a step of supplying an oxygen-containing gas to the process chamber, and a step of exhausting the process chamber.

DETAILED DESCRIPTION

Figure 1:
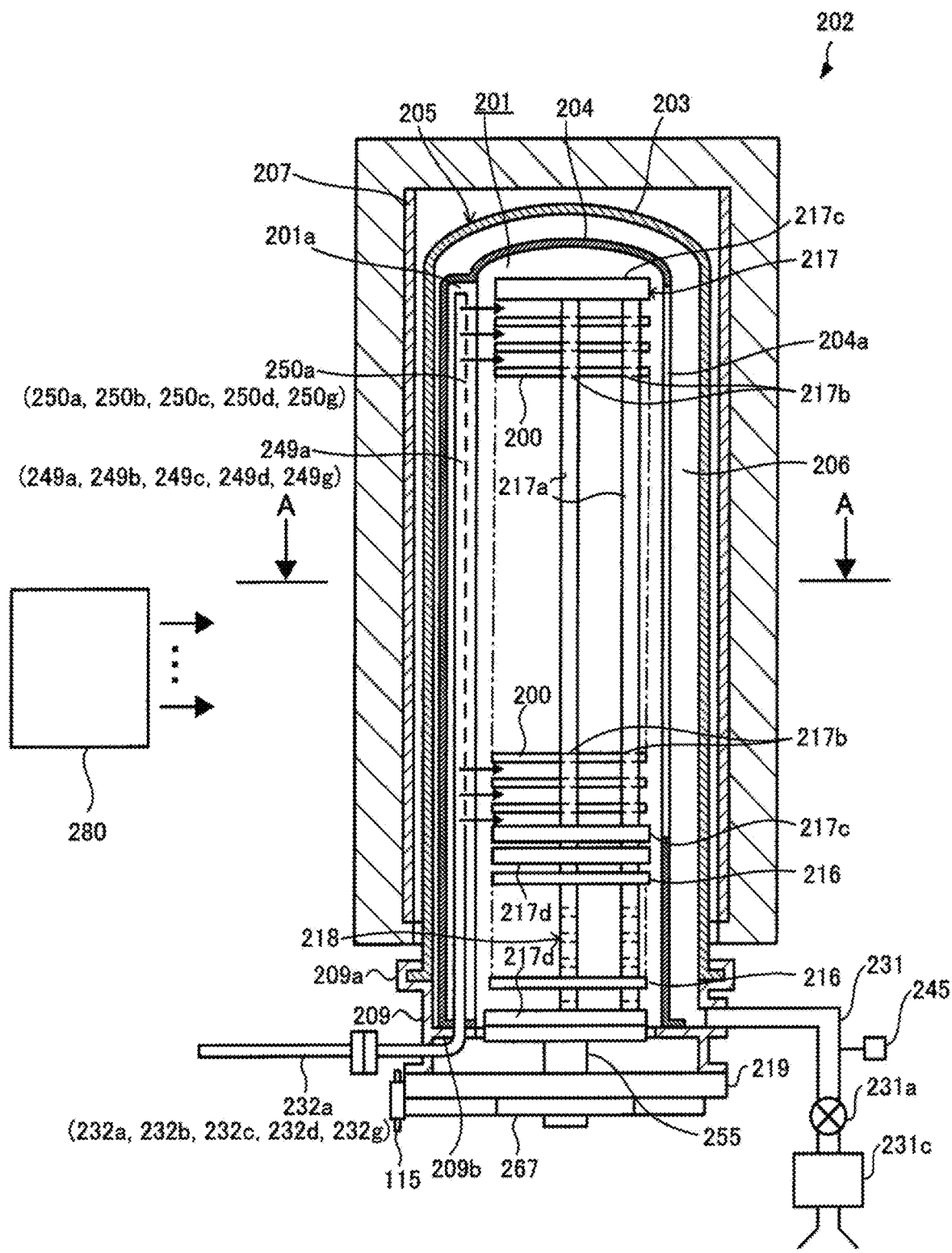
FIG. 1 is a schematic configuration view for explaining a vertical process furnace of a substrate processing apparatus according to a preferable embodiment of this present disclosure, and illustrates a longitudinal cross-sectional view of a process furnace portion.

Hereinafter, a preferable embodiment of this present disclosure will be described in more detail with reference to FIGS. 1 to 4.

The following description describes, as an example of a substrate processing apparatus, a case where a substrate processing apparatus which is a batch-type vertical apparatus for performing a film formation process or the like on a plurality of substrates at a time is used in a method for manufacturing a semiconductor device used in one step in a process of manufacturing a semiconductor device.

(Process Chamber)

A process furnace 202 includes a vertical process tube 205 as a reaction tube disposed vertically such that a center line is vertical and fixedly supported by a casing (not illustrated). The process tube 205 includes an inner tube 204 and an outer tube 203. Each of the inner tube 204 and the outer tube 203 is integrally molded in a cylindrical shape with a material having high heat resistance, such as quartz ($SiO_2$), silicon carbide (SiC), or a composite material of quartz or silicon carbide.

The inner tube 204 is formed in a cylindrical shape having an upper end closed and a lower end opened. In the inner tube 204, a process chamber 201 for housing and processing wafers 200 stacked in a multistage in a horizontal posture with a boat 217 as a substrate support member is formed. A lower end opening of the inner tube 204 configures a furnace port for taking in and out the boat 217 holding the wafer 200 group. Therefore, the inner diameter of the inner tube 204 is set to be larger than the maximum outer diameter of the boat 217 holding the wafer 200 group. The outer tube 203 is formed in a cylindrical shape in which a part thereof is concentric with the inner tube 204, the inner diameter thereof is larger than that of the inner tube 204, an upper end thereof is closed, and a lower end thereof is opened, and covers the inner tube 204 so as to surround an outer side of the inner tube 204 while being concentric with the inner tube 204. A lower end portion of the outer tube 203 is attached to a flange 209a on an upper portion of a manifold 209 via an O-ring (not illustrated), and is airtightly sealed by the O ring. A lower end portion of the inner tube 204 is mounted on a circular ring portion 209b inside the manifold 209. The manifold 209 is supported by a casing (not illustrated), and the process tube 205 is thereby vertically installed. Hereinafter, a space formed in the outer tube 203 may be referred to as the process chamber 201.

(Exhaust Unit)

An exhaust pipe 231 for discharging an atmosphere in the process chamber 201 is connected to a part of a side wall of the manifold 209. An exhaust port for discharging the atmosphere in the process chamber 201 is formed at a connection portion between the manifold 209 and the exhaust pipe 231. An interior of the exhaust pipe 231 communicates with an interior of an exhaust passage including a gap formed between the inner tube 204 and the outer tube 203 via the exhaust port. This makes it possible to uniformly exhaust from an upper end to a lower end of a later-described exhaust hole 204a formed in the inner tube 204. That is, all of the plurality of wafers 200 placed on the boat 217 can be exhausted uniformly. The exhaust pipe 231 includes a pressure sensor 245, an auto pressure controller (APC) valve 231a as a pressure regulator, and a vacuum pump 231c as a vacuum-exhaust device in order from an upstream. The vacuum pump 231c is configured such that a pressure in the process chamber 201 can be vacuum-exhausted to a predetermined pressure (degree of vacuum). A controller 280 is electrically connected to the APC valve 231a and the pressure sensor 245. The controller 280 is configured to control the opening degree of the APC valve 231a based on a pressure detected by the pressure sensor 245 such that a pressure in the process chamber 201 becomes a desired pressure at a desired timing. An exhaust unit (exhaust system) according to the present embodiment is mainly configured by the exhaust pipe 231, the pressure sensor 245, and the APC valve 231a. The vacuum pump 231c may be included in the exhaust unit.

(Substrate Support Member)

A seal cap 219 for closing a lower end opening of the manifold 209 is brought into contact with the manifold 209 from a lower side in a vertical direction. The seal cap 219 is formed in a disk shape having an outer diameter equal to or larger than the outer diameter of the outer tube 203, and is raised and lowered in a horizontal posture in a vertical direction by a later-described boat elevator 115 disposed vertically outside the process tube 205.

The boat 217 which is a substrate support member as a substrate holding means (substrate support means) for holding the wafers 200 vertically stands on the seal cap 219 to be supported. The boat 217 includes a pair of upper and lower end plates 217c and a plurality of retainers 217a vertically disposed between the end plates 217c. The end plates 217c and the retainers 217a are made of a heat resistant material such as quartz ($SiO_2$), silicon carbide (SiC), or a composite material of quartz or silicon carbide. A plurality of holding grooves 217b is disposed at equal intervals in a longitudinal direction in each of the retainers 217a. A circumferential edge of each of the wafers 200 is inserted into each of the holding grooves 217b in the same stage in the plurality of retainers 217a, and the plurality of wafers 200 is thereby stacked in a multistage in a horizontal posture while centers thereof are aligned to each other, and is held.

A pair of upper and lower auxiliary end plates 217d is disposed while being supported by a plurality of auxiliary retainers 218 between the boat 217 and the seal cap 219. A plurality of holding grooves is formed in each of the auxiliary retainers 218. In each of the holding grooves, a plurality of disc-shaped heat insulating plates 216 each made of a heat-resistant material such as quartz ($SiO_2$) or silicon carbide (SiC) is loaded in a multistage in a horizontal posture.

A rotation mechanism 267 for rotating the boat 217 is disposed in the seal cap 219 on the opposite side to the process chamber 201. A rotation shaft 255 of the rotation mechanism 267 passes through the seal cap 219 and supports the boat 217 from below. By rotating the rotation shaft 255, the wafers 200 can be rotated in the process chamber 201. The seal cap 219 is configured to be raised and lowered in a vertical direction by the boat elevator 115 as a transfer means (transfer mechanism). This makes it possible to transfer the boat 217 into and out of the process chamber 201.

(Heater Unit)

A heater unit 207 as a heating means (heating mechanism) for heating an interior of the process tube 205 uniformly or in a predetermined temperature distribution is disposed outside the outer tube 203 so as to surround the outer tube 203. The heater unit 207 is vertically installed by being supported by a casing (not illustrated) of the substrate processing apparatus, and is configured as a resistance heater such as a carbon heater. A temperature sensor 269 as a temperature detector is disposed in the process tube 205. A heating unit (heating system) according to the present embodiment is mainly configured by the heater unit 207 and the temperature sensor 269.

(Gas Supply Unit)

Figure 2:
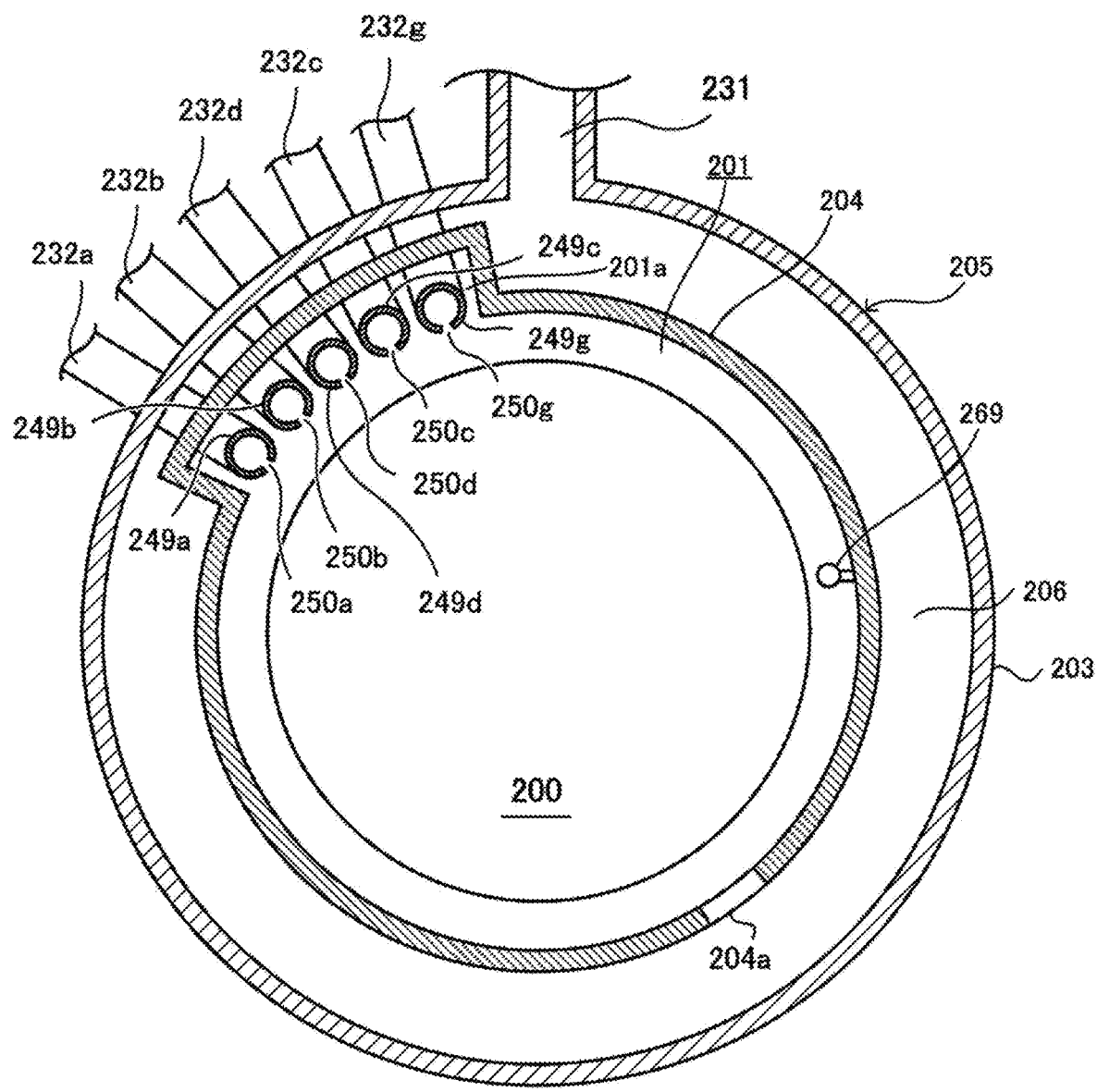
FIG. 2 is a schematic transverse cross-sectional view illustrating a process furnace portion of the vertical process furnace illustrated in FIG. 1 as a cross-sectional view taken along line A-A in FIG. 1.

A channel-shaped preliminary chamber 201a is formed on a side wall (at a position 180 degrees opposite to the exhaust hole 204a described later) of the inner tube 204 so as to protrude outward in a radial direction of the inner tube 204 from the side wall of the inner tube 204 and extend long in a vertical direction. A side wall of the preliminary chamber 201a configures a part of the side wall of the inner tube 204. An inner wall of the preliminary chamber 201a forms a part of an inner wall of the process chamber 201. In the preliminary chamber 201a, along the inner wall of the preliminary chamber 201a (that is, the inner wall of the process chamber 201), nozzles 249a, 249b, 249c, 249d, and 249g for supplying a gas into the process chamber 201 are disposed while extending from a lower portion to an upper portion along the inner wall of the preliminary chamber 201a in a stacking direction of the wafers 200. That is, the nozzles 249a, 249b, 249c, 249d, and 249g are disposed along a wafer arrangement region in a region horizontally surrounding the wafer arrangement region on a lateral side of the wafer arrangement region where the wafers 200 are arranged. The nozzles 249a, 249b, 249c, 249d, and 249g are configured as L-shaped long nozzles. Horizontal portions thereof are disposed so as to pass through the manifold 209, and vertical portions thereof are disposed so as to stand at least from one end side of the wafer arrangement region to the other end side thereof. For convenience, one nozzle is illustrated in FIG. 1, but actually five nozzles 249a, 249b, 249c, 249d, and 249g are disposed as illustrated in FIG. 2. Many gas supply holes 250a, 250b, 250c, 250d, and 250g for supplying a gas is disposed on side surfaces of the nozzles 249a, 249b, 249c, 249d, and 249g at heights facing the wafers in the process chamber 201, respectively. The gas supply holes 250a, 250b, 250c, 250d, and 250g have the same opening area or different opening areas with sizes inclined from a lower portion to an upper portion, and are disposed at the same opening pitch.

End portions of the horizontal portions of the nozzles 249a, 249b, 249c, 249d, and 249g which have passed through the manifold 209 are connected to the gas supply pipes 232a, 232b, 232c, 232d, and 232g as gas supply lines outside the process tube 205, respectively.

As described above, in a gas supply method in the present embodiment, a gas is transferred via the nozzles 249a, 249b, 249c, 249d, and 249g disposed in the preliminary chamber 201a, and the gas is injected into the inner tube 204 for the first time in the vicinity of the wafers 200 from the gas supply holes 250a, 250b, 250c, 250d, and 250g opened to the nozzles 249a, 249b, 249c, 249d, and 249g.

The exhaust hole 204a which is a slit-shaped through-hole is opened slenderly in a vertical direction at a position facing the nozzles 249a, 249b, 249c, 249d, and 249g on a side wall of the inner tube 204, that is, at a position 180 degrees opposite to the preliminary chamber 201a. The process chamber 201 communicates with an exhaust passage 206 including a gap formed between the inner tube 204 and the outer tube 203 via the exhaust hole 204a. Therefore, the gas supplied into the process chamber 201 from the gas supply holes 250a, 250b, 250c, 250d, and 250g of the nozzles 249a, 249b, 249c, 249d, and 249g flows into the exhaust passage 206 via the exhaust hole 204a, then flows into the exhaust pipe 231 via an exhaust port, and is discharged to an outside of the process furnace 202. At this time, the gas supplied to the vicinity of the wafers 200 in the process chamber 201 from the gas supply holes 250a, 250b, 250c, 250d, and 250g flows in a horizontal direction, that is, in a direction parallel to surfaces of the wafers 200, and then flows into the exhaust passage 206 via the exhaust hole 204a. That is, a main flow of the gas in the process chamber 201 is in a horizontal direction, that is, in a direction parallel to the surfaces of the wafers 200. With such a configuration, a gas can be uniformly supplied to each of the wafers 200, and the film thickness of a thin film formed on each of the wafers 200 can be made uniform. The exhaust hole 204a may be configured by a plurality of holes without being limited to a case where the exhaust hole 204a is configured as a slit-like through-hole.

Figure 3:
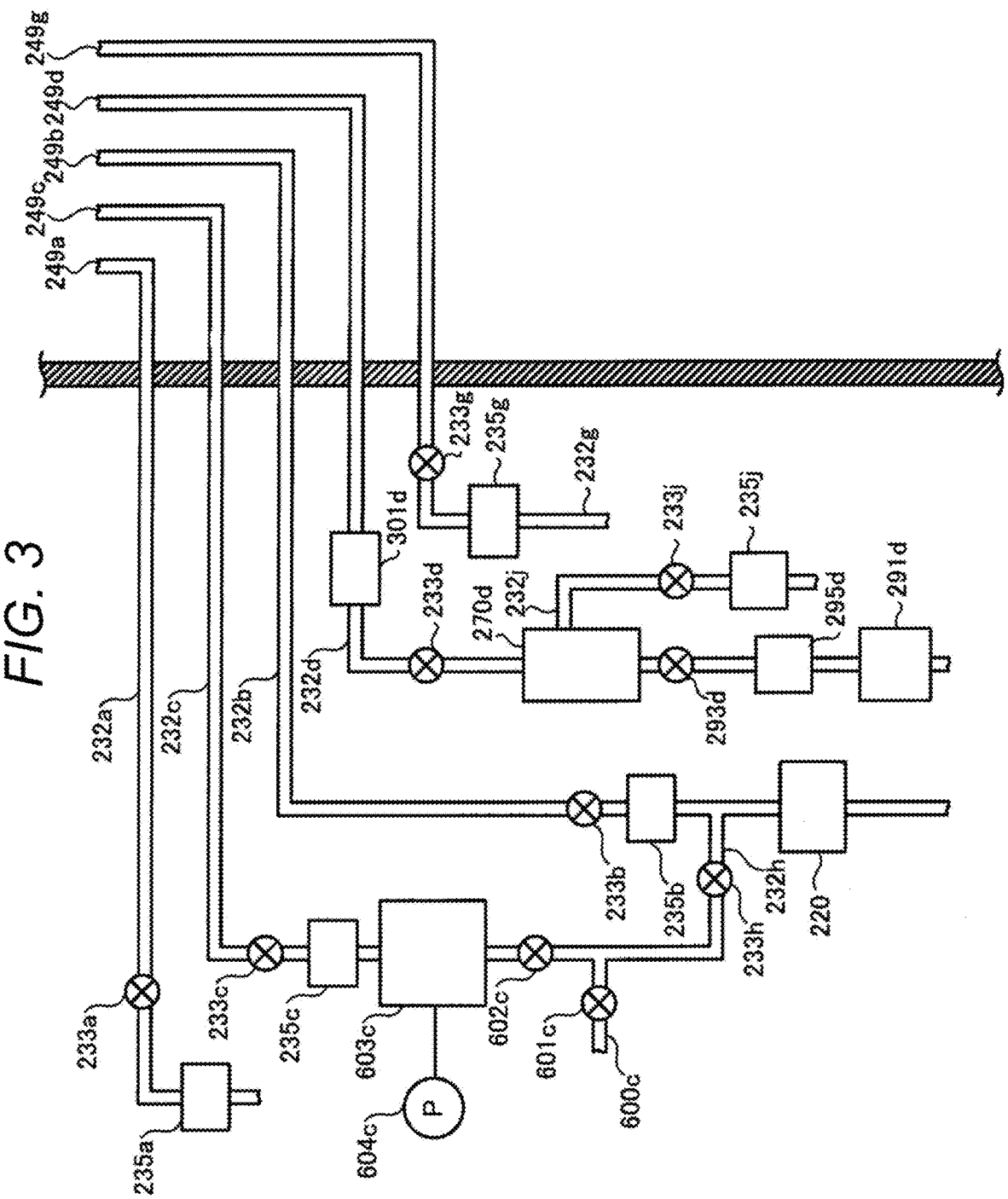
FIG. 3 is a schematic diagram for explaining a source supply system of a substrate processing apparatus according to a preferable embodiment of this present disclosure.

Next, a gas supply system according to the present embodiment will be described with reference to FIG. 3.

(Inert Gas Supply System)

MFCs (mass flow controllers) 235a and 235g as flow rate control devices (flow rate control unit) and valves 233a and 233g as on-off valves are disposed in the gas supply pipes 232a and 232g in order from an upstream side. For example, a nitrogen ($N_2$) gas which is an inert gas is supplied to the process chamber 201 through the gas supply pipes 232a and 232g and the nozzles 249a and 249g. A first inert gas supply system is mainly configured by the nozzle 249a, the gas supply pipe 232a, the MFC 235a, and the valve 233a. A second inert gas supply system is mainly configured by the nozzle 249g, the gas supply pipe 232g, the MFC 235g, and the valve 233g.

An inert gas supply system is configured by either or both of the first inert gas supply system and the second inert gas supply system. These two systems may be properly used according to processing to a substrate. However, uniform processing can be applied to the substrate by using both of the first inert gas supply system and the second inert gas supply system. As illustrated in FIG. 2, the nozzles 249a and 249g are preferably disposed so as to sandwich another nozzle therebetween. With such an arrangement, processing uniformity to the wafers 200 can be improved.

(Oxygen-Containing Gas Supply System)

An ozonizer 220 which is an ozone generator, an MFC 235b, and a valve 233b are disposed in the gas supply pipe 232b in order from an upstream side. The above-described nozzle 249b is connected to a tip portion of the gas supply pipe 232b.

An upstream side of the gas supply pipe 232b is connected to an oxygen gas supply source (not illustrated) for supplying, for example, an oxygen ($O_2$) gas which is an oxidizing gas as an oxygen-containing gas. The $O_2$ gas supplied to the ozonizer 220 becomes an ozone ($O_3$) gas which is an oxidizing gas as a first oxygen-containing gas and is supplied into the process chamber 201. A first oxygen-containing gas supply system (also referred to as a first oxidizing gas supply system or a first processing gas supply system) is mainly configured by the nozzle 249b, the gas supply pipe 232b, the MFC 235b, and the valve 233b. The ozonizer 220 may be included in the first oxygen-containing gas supply system.

First, a gas supply pipe 232h is connected to an upstream side of the MFC 235b of the gas supply pipe 232b, and a gas supply pipe 232c is further connected to the gas supply pipe 232h. In the gas supply pipe 232c, in order from an upstream side, a vent line 600c which is a detoxifying line for discharging a gas to an ozone killer (not illustrated) as an inactivation mechanism (detoxifying mechanism) for inactivating an $O_3$ gas, a valve 601c for controlling ON/OFF of gas supply to the ozone killer, a valve 602c, a gas tank (ozone storage mechanism) 603c as a gas reservoir for storing a gas, a pressure sensor 604c for measuring a pressure in the gas tank, an MFC 235c, and a valve 233c are disposed. As a flow of the gas, for example, an $O_3$ gas generated by the ozonizer 220 is supplied to the gas tank 603c through the gas supply pipe 232c via the gas supply pipes 232b and 232h, and is stored in the gas tank 603c until a predetermined pressure is reached. The MFC 235c adjusts a flow rate, and then the $O_3$ gas is supplied from the gas tank 603c to the process chamber 201 via the valve 233c. A second oxygen-containing gas supply system (also referred to as a second oxidizing gas supply system or a second processing gas supply system) is mainly configured by the nozzle 249c, the gas supply pipe 232c, the MFC 235c, the valve 233c, the gas tank 603c, and the pressure sensor 604c. An extra amount of $O_3$ gas generated when the pressure in the gas tank 603c becomes equal to or higher than a predetermined pressure is discharged from the vent line 600c to the ozone killer not via the process chamber 201 using the valve 601c, the valve 602c, and the vent line 600c as necessary.

An oxygen-containing gas supply system is configured by the first oxygen-containing gas supply system and the second oxygen-containing gas supply system. The oxygen-containing gas supply system may also be referred to as an ozone supply mechanism.

(Source Gas Supply System)

In the gas supply pipe 232d, a vaporizer 270d which is a vaporizing device (vaporizing portion) and vaporizes a liquid source to generate a vaporized gas as a source gas (first source gas) is disposed, and a valve 233d and a gas filter 301d are further disposed in order from a downstream side of the vaporizer 270d. The vaporizer 270d is maintained at a temperature corresponding to a liquid source used. The above-described nozzle 249d is connected to a tip portion of the gas supply pipe 232d. By opening the valve 233d, a vaporized gas generated in the vaporizer 270d is supplied into the process chamber 201 via the nozzle 249d. A source gas supply system (also referred to as a first source gas supply system or a third processing gas supply system) is mainly configured by the nozzle 249d, the valve 233d, the gas supply pipe 232d, and the gas filter 301d. The vaporizer 270d may be included in the source gas supply system.

A liquid source supply system or a carrier gas supply system described later may also be included in the source gas supply system.

(Liquid Source Supply System)

A liquid source tank 291d, a liquid flow rate control device (liquid mass flow controller, LMFC) 295d, and a valve 293d are disposed in order from an upstream side in an upstream of the vaporizer 270d of the gas supply pipe 232d. The amount of the liquid source supplied into the vaporizer 270d (that is, supply flow rate of a vaporized gas vaporized in the vaporizer 270d and supplied into the process chamber 201) is controlled by the LMFC 295d. A liquid source supply system (first liquid source supply system) is mainly configured by the gas supply pipe 232d, the LMFC 295d, and the valve 293d. The liquid source tank 291d may be included in the liquid source supply system.

(Carrier Gas Supply System)

An inert gas (for example, an $N_2$ gas) as a carrier gas is supplied from a gas supply pipe 232j to the vaporizer 270d. An MFC 235j and a valve 233j are disposed in the gas supply pipe 232j. It is possible to adjust uniformity of processing of the wafers 200 among the wafers 200, such as film thickness uniformity between the wafers 200 mounted on the boat 217 by diluting a vaporized gas generated by the vaporizer 270d with a carrier gas. A carrier gas supply system (first carrier gas supply system) is mainly configured by the gas supply pipe 232j, the MFC 235j, and the valve 233j.

From the gas supply pipe 232d, for example, a zirconium source gas as a source gas which is an organic metal-containing gas, that is, a gas containing zirconium (Zr) element (zirconium-containing gas) is supplied as a first source gas into the process chamber 201 via the LMFC 295d, the vaporizer 270d, the gas filter 301d, the nozzle 249d, and the like. As the zirconium-containing gas, for example, tetrakisethylmethylamino zirconium (TEMAZ, $Zr[N(CH_3)C_2H_5]_4$) can be used. TEMAZ is liquid at normal temperature and normal pressure. Liquid TEMAZ is stored in the liquid source tank 291d as a liquid source. At this time, the vaporizer 270d is maintained at a temperature suitable for TEMAZ, and is maintained while the vaporizer 270d is heated to, for example, 120 to 170° C.

(Controller)

Figure 4:
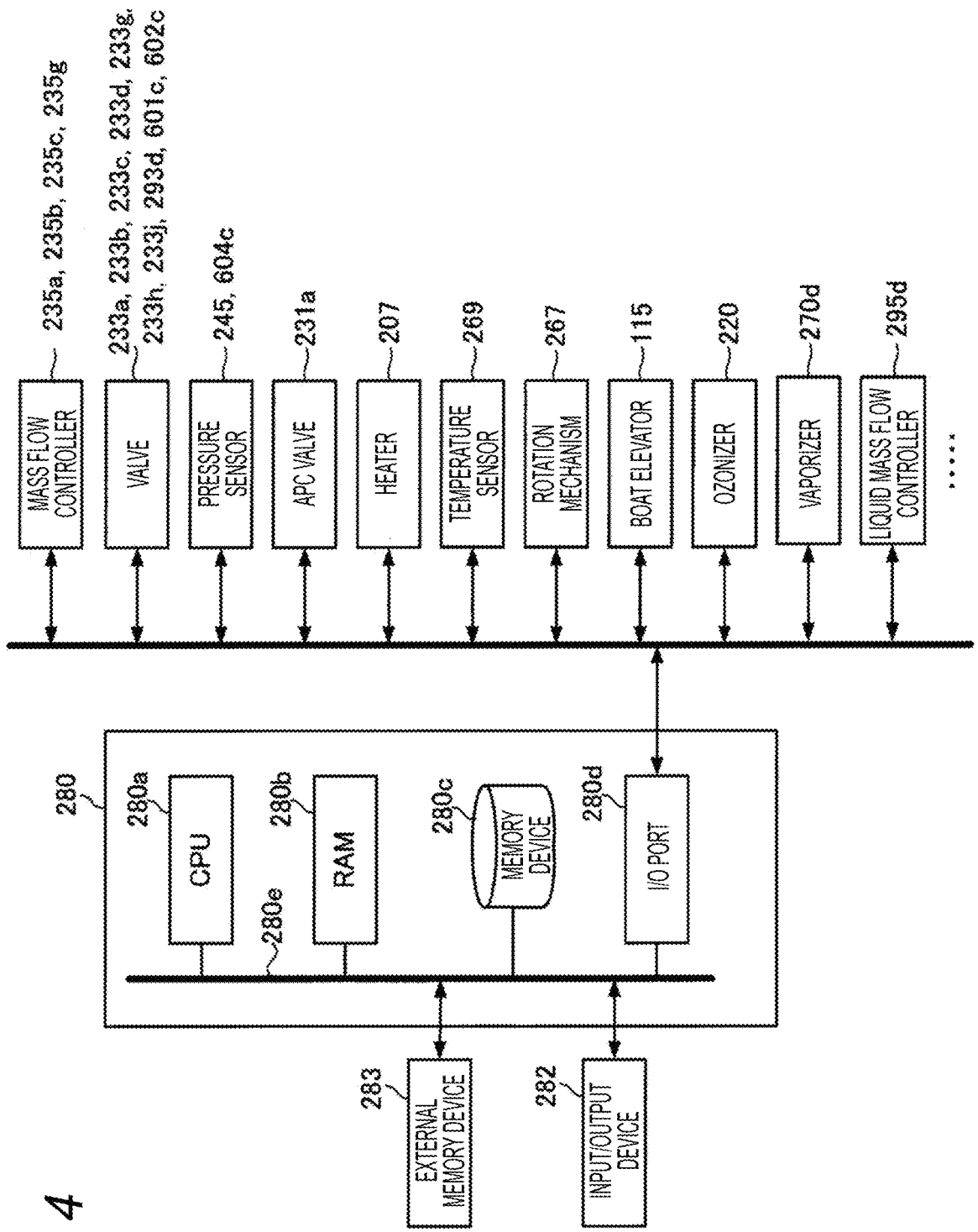
FIG. 4 is a schematic diagram for explaining a controller of a substrate processing apparatus according to a preferable embodiment of this present disclosure.

FIG. 4 illustrates an example of connection between a controller and each configuration according to the present embodiment. The controller 280 which is a controller (control means) is configured as a computer including a central processing unit (CPU) 280a, a random access memory (RAM) 280b, a memory device 280c, and an I/O port 280d. The RAM 280b, the memory device 280c, and the I/O port 280d are configured so as to be able to exchange data with the CPU 280a via an internal bus 280e. An input/output device 282 configured, for example, as a touch panel is connected to the controller 280.

The memory device 280c is configured, for example, by a flash memory and a hard disk drive (HDD). In the memory device 280c, a control program for controlling an operation of a substrate processing apparatus, a process recipe in which procedures and conditions of substrate processing described later are written, and the like are readably stored. The process recipe is such a combination that a predetermined result can be obtained by causing the controller 280 to execute procedures in a substrate processing step described later, and functions as a program. Hereinafter, the process recipe, the control program, and the like are also collectively referred to simply as a program. Here, the term "program" may include only the process recipe itself, may include only the control program itself, or may include both of these. The RAM 280b is configured as a memory area (work area) in which a program, data, or the like read by the CPU 280a is temporarily stored.

The I/O port 280d is connected to the MFCs 235a, 235b, 235c, and 235g, the valves 233a, 233b, 233c, 233d, 233g, 233h, 233j, 293d, 601c, and 602c, the pressure sensors 245 and 604c, the APC valve 231a, the vacuum pump 231c, the heater unit 207, the temperature sensor 269, the rotation mechanism 267, the boat elevator 115, the ozonizer 220, the vaporizer 270d, the LMFC 295d, and the like.

The CPU 280a reads a control program from the memory device 280c and executes the program, and reads a process recipe from the memory device 280c in accordance with input of an operation command from the input/output device 282 or the like. The CPU 280a is configured to, according to the contents of the process recipe thus read, control flow rate adjusting operations of various gases by the MFC 235a, 235b, 235c, and 235g, flow rate control of a liquid source by the LMFC 295d, opening/closing operations of the valves 233a, 233b, 233c, 233d, 233g, 233h, 233j, 293d, 601c, and 602c, a pressure control operation in a gas tank by the pressure sensor 604c, an opening/closing operation of the APC valve 231a, a pressure adjusting operation by the APC valve 231a based on the pressure sensor 245, a temperature adjusting operation of the heater unit 207 based on the temperature sensor 269, start and stop of the vacuum pump 231c, operations of rotating the boat 217 with the rotation mechanism 267 and adjusting a rotational speed of the boat 217, and an operation of raising and lowering the boat 217 by the boat elevator 115, and the like.

The controller 280 can be configured, for example, by installing the above-described program stored in an external memory device (for example, a magnetic tape, a magnetic disk such as a flexible disk or a hard disk, an optical disk such as a CD or a DVD, a magneto-optical disk such as an MO, or a semiconductor memory such as a USB memory (USB flash drive) or a memory card) 283 into a computer. Provision of a program to a computer may be performed using a communication means such as the Internet or a dedicated line without using the external memory device 283. The memory device 280c or the external memory device 283 is configured as a non-transitory computer-readable recording medium. Hereinafter, these are also collectively and simply referred to as a non-transitory computer-readable recording medium. Here, the term "non-transitory computer-readable recording medium" may include only the memory device 280c itself, may include only the external memory device 283 itself, or may include both of these.

(Substrate Processing Step)

Next, as one step in a process of manufacturing a semiconductor device using a process furnace of the above-described substrate processing apparatus, a sequence example in which a zirconium oxide film ($ZrO_2$, hereinafter also referred to as ZrO) is formed as a metal oxide film which is an insulating film and, for example, a high dielectric constant (High-k) film on a substrate will be described with reference to FIG. 5. In the following description, an operation of each part included in the substrate processing apparatus is controlled by the controller 280.

Here, the term "wafer" may mean "a wafer itself" or "a stacked body (assembly) of a wafer and a predetermined layer, film, or the like formed on a surface of the wafer" (that is, a wafer may mean a wafer including a predetermined layer, film, or the like formed on a surface of the wafer). Here, the term "surface of a wafer" may mean "a surface of a wafer itself (exposed surface)" or "a surface of a predetermined layer, film, or the like formed on the wafer, that is, an outermost surface of the wafer as a stacked body".

Accordingly, here, the phrase "a predetermined gas is supplied to a wafer" may mean that "a predetermined gas is directly supplied to a surface (exposed surface) of a wafer itself", or may mean "a predetermined gas is supplied to a layer, a film, or the like formed on a wafer, that is, to an outermost surface of a wafer as a stacked body".

Here, the term "substrate" is similarly used to a case where the term "wafer" is used.

The substrate processing step will be described.

When the plurality of wafers 200 is loaded (wafer charged) on the boat 217, the boat 217 supporting the plurality of wafers 200 is raised by the boat elevator 115 and is loaded (boat loaded) into the process chamber 201. In this state, the seal cap 219 seals a lower end of the manifold 209.

An interior of the process chamber 201 is vacuum-exhausted by the vacuum pump 231c so as to have a desired pressure (degree of vacuum). At this time, a pressure in the process chamber 201 is measured by the pressure sensor 245, and the APC valve 231a is feedback-controlled based on the measured pressure (pressure adjustment). The interior of the process chamber 201 is heated by the heater unit 207 so as to have a desired temperature. At this time, the degree of energization to the heater 207 is feedback-controlled based on temperature information detected by the temperature sensor 269 such that the interior of the process chamber 201 has a desired temperature distribution. Subsequently, the boat 217 is rotated by the rotation mechanism 267, and the wafers 200 are thereby rotated.

The vacuum pump 231c maintains a state of being normally operated at least until processing on the wafers 200 is completed. Heating in the process chamber 201 by the heater 207 is continuously performed at least until processing on the wafers 200 is completed. The rotation of the boat 217 and the wafers 200 by the rotation mechanism 267 is continuously performed at least until processing on the wafers 200 is completed.

Next, by supplying a TEMAZ gas and an $O_3$ gas into the process chamber 201, an insulating film forming step of forming a ZrO film which is an insulating film is performed. In the insulating film forming step, the following four steps are sequentially performed.

(ZrO Film Forming Step)
<Step S101>

In step S101 (refer to FIG. 5, first step, TEMAZ gas supply step), first, a TEMAZ gas is caused to flow. The valve 233d of the gas supply pipe 232d is opened, and the TEMAZ gas is caused to flow into the gas supply pipe 232d via the vaporizer 270d and the gas filter 301d. The flow rate of the TEMAZ gas flowing in the gas supply pipe 232d is adjusted by the LMFC 295d. The TEMAZ gas the flow rate of which is adjusted is supplied into the process chamber 201 from the gas supply hole 250d of the nozzle 249d and is discharged from the gas exhaust pipe 231. At this time, the valve 233j is opened simultaneously and an inert gas such as an $N_2$ gas is caused to flow into the inert gas supply pipe 232j. The flow rate of the $N_2$ gas flowing in the inert gas supply pipe 232j is adjusted by the MFC 235j. The $N_2$ gas the flow rate of which is adjusted is supplied into the process chamber 201 together with the TEMAZ gas, and is discharged from the gas exhaust pipe 231. Furthermore, the valves 233a and 233g are opened, and an inert gas such as an $N_2$ gas is caused to flow from the gas supply pipes 232a and 232g, the nozzles 249a and 249g, and the gas supply holes 250a and 250g. That is, a mixed gas of the TEMAZ gas and the inert gas is supplied onto each of the wafers 200.

At this time, the APC valve 231a is appropriately adjusted, and a pressure in the process chamber 201 is set to, for example, 100 to 150 Pa. Here, the phrase "100 to 150 Pa" may mean "not less than 100 Pa and not greater than 150 Pa". The supply flow rate of the TEMAZ gas controlled by the LMFC 295d is set to, for example, 0.5 to 3 g/min. Time of exposing the wafers 200 to the TEMAZ gas, that is, gas supply time (irradiation time) is set to, for example, 30 to 120 seconds. By making the supply time of the TEMAZ gas as short as possible in this manner, a deposition reaction due to an excessive supply amount of the TEMAZ gas is suppressed, and a film having excellent uniformity can be formed. At this time, the temperature of the heater unit 207 is set to such a temperature that makes the temperature of the wafers 200, for example, 180 to 250° C.

A flow velocity of a mixed gas on each of the wafers 200 at this time is about 2 to 4 times a flow velocity 3.9 m/s at the time of supplying a conventional Zr-containing gas ($N_2$ gas supply flow rate 16.1 slm, partial pressure 0.54), and preferably within a range of about 3 times. Here, a flow velocity of the mixed gas on each of the wafers 200 is calculated by simulation. By increasing the flow velocity on each of the wafers 200 at the time of supplying the TEMAZ gas and reducing the partial pressure of the TEMAZ gas in the mixed gas, excessive supply to an upper portion of the wafers 200 is reduced, and therefore deterioration of step coverage is suppressed. Here, if the flow velocity on each of the wafers is increased to a value more than four times, the partial pressure of the TEMAZ gas in the mixed gas becomes too low, and the gas cannot be sufficiently supplied to a lower portion of the wafers 200.

That is, the flow velocity of the mixed gas on each of the wafers 200 at the time of supplying the TEMAZ gas is set to, for example, 7.8 to 15.6 m/s, and preferably about 11 m/s. The $N_2$ gas supply flow rate at this time is set to, for example, 30.9 to 55.6 slm, and preferably about 41.5 slm. The partial pressure of the TEMAZ gas in the mixed gas at this time is set to, for example, about 0.167 to 0.3, and preferably about 0.218. By the supply of the TEMAZ gas, Zr molecules are adsorbed on the wafers 200 due to a reaction between O adsorbed on the wafers 200 and a Zr-containing gas, and a Zr-containing layer is formed on each of the wafers 200.

In the present embodiment, in order to raise the flow velocity on each of the wafers at the time of supplying the TEMAZ gas, a flow rate of the gas flowing out of each one of the gas supply holes 250d, 250a, and 250g of the nozzles 249d, 249a, and 249g is increased. In order to raise the flow velocity of the gas, the number of substrates that can be housed in the process chamber 201 (the number of substrates to be stacked) is set to, for example, 10 to 125, and preferably 50 to 60. One nozzle hole is opened for one substrate. Therefore, by reducing the number of the substrates, it is possible to increase a flow rate of a gas flowing out of one hole and to increase a gas flow velocity.

In this step, the partial pressure of the TEMAZ gas in the mixed gas may be fixed to a predetermined value (about 0.167 to 0.3, preferably about 0.218). By fixing the partial pressure of the TEMAZ gas in the mixed gas in this step to a predetermined value, it is possible to suppress a deposition reaction due to excessive supply of a source and to prevent a decrease in film formation rate due to insufficient supply of the source. At this time, it is necessary to increase the flow rate of the TEMAZ gas which is a Zr-containing gas by an amount corresponding to the increase in the $N_2$ gas flow rate. However, when the flow rate of the Zr-containing gas is increased excessively, Zr causes a deposition reaction. That is, the flow rate of the Zr-containing gas is set to 0.1 to 0.3 slm, and preferably about 0.15 slm.

<Step S102>

In step S102 (refer to FIG. 5, second step), the valve 233d is closed, and supply of the TEMAZ gas into the process chamber 201 is stopped. At this time, with the APC valve 231a of the gas exhaust pipe 231 open, an interior of the process chamber 201 is vacuum-exhausted by the vacuum pump 231c, and the TEMAZ gas which remains in the process chamber 201 and is unreacted or has contributed to formation of the Zr-containing layer is discharged from the interior of the process chamber 201.

At this time, with the valves 233a and 233g open, supply of the $N_2$ gas as an inert gas into the process chamber 201 is maintained. The $N_2$ gas acts as a purge gas. The TEMAZ gas which remains in the process chamber 201 and is unreacted or has contributed to formation of the Zr-containing layer, such as Zr molecules, is thereby removed from the interior of the process chamber 201, and gas substitution with the $N_2$ gas is performed.

<Step S103>

In step S103 (refer to FIG. 5, third step, $O_3$ gas supply step), an $O_3$ gas is simultaneously supplied into the process chamber 201 from the gas supply holes 250b and 250c of the nozzles 249b and 249c. The term "simultaneously" means that it is only required to have a timing of supply from both of the gas supply holes 250b and 250c of the nozzles 249b and 249c, and the timing to start supply and/or stop supply is not necessarily the same. Time for supplying the $O_3$ gas from the gas supply hole 250b of the nozzle 249b and time for supplying the $O_3$ gas from the gas supply hole 250c of the nozzle 249c are not necessarily the same.

Specifically, after a residual gas in the process chamber 201 is removed, the valve 233b and 233c of the gas supply pipe 232b are opened, and the valves 601c, 602c, and 233h of the vent line 600c are closed. The $O_3$ gas generated by the ozonizer 220 and the $O_3$ gas stored in the gas tank 603c are thereby adjusted in flow rate by the MFCs 235b and 235c, are supplied into the process chamber 201 from the gas supply holes 250b and 250c of the nozzles 249b and 249c, and are discharged from the gas exhaust pipe 231. Furthermore, the valves 233a and 233g are opened, and an inert gas such as an $N_2$ gas is caused to flow from the gas supply pipes 232a and 232g, the nozzles 249a and 249g, and the gas supply holes 250a and 250g. In S103, the valve 233h may be open.

When the $O_3$ gas is caused to flow, the APC valve 231a is properly adjusted to set the pressure in the process chamber 201 to, for example, 50 to 500 Pa. The supply flow rate of the $O_3$ gas controlled by the MFCs 235b and 235c is set to, for example, 5 to 30 slm. Time of exposing the wafers 200 to the $O_3$ gas, that is, gas supply time (irradiation time) is set to, for example, 10 to 300 seconds. At this time, the temperature of the heater unit 207 is set to a temperature at which the temperature of the wafers 200 is 180 to 250° C. as in step S101. By the supply of the $O_3$ gas, a ZrO layer is formed by a reaction between Zr molecules adsorbed on each of the wafers 200 and 0.

<Step S104>

In step S104 (refer to FIG. 5, fourth step), the valves 233b and 233c of the gas supply pipe 232b are closed, the valves 233h and 602c are opened, supply of the $O_3$ gas into the process chamber 201 is stopped, and the $O_3$ gas is caused to flow to the gas tank 603c. At this time, with the APC valve 231a of the gas exhaust pipe 231 open, the interior of the process chamber 201 is vacuum-exhausted by the vacuum pump 231c, and the $O_3$ gas which remains in the process chamber 201 and is unreacted or has contributed to oxidation is eliminated from the interior of the process chamber 201. When the pressure in the gas tank 603c reaches a predetermined pressure, the valve 602c is closed, the valve 601c is opened, and an extra amount of $O_3$ gas is caused to flow to the vent line 600c. At this time, with the valves 233a and 233g open, supply of the $N_2$ gas as an inert gas into the process chamber 201 is maintained. The $N_2$ gas acts as a purge gas, and the $O_3$ gas which remains in the process chamber 201 and is unreacted or has contributed to formation of the ZrO layer is thereby discharged from the interior of the process chamber 201.

By assuming the above-described steps S101 to S104 as one cycle and performing this cycle at least one time, it is possible to form a high dielectric constant film containing zirconium and oxygen and having a predetermined film thickness, that is, a ZrO film on each of the wafers 200. In addition, the above-described cycle is preferably performed a plurality of times. As a result, a ZrO film having a predetermined film thickness is formed on each of the wafers 200.

After the ZrO film is formed, with the valves 233a and 233g of the inert gas supply pipes 232a and 232g open, an $N_2$ gas is caused to flow into the process chamber 201. The $N_2$ gas acts as a purge gas. The interior of the process chamber 201 is thereby purged by the inert gas, and the gas remaining in the process chamber 201 is removed from the interior of the process chamber 201 (purge). Thereafter, the atmosphere in the process chamber 201 is replaced with the inert gas, and the pressure in the process chamber 201 is returned to a normal pressure (returned to an atmospheric pressure).

Thereafter, the seal cap 219 is lowered by the boat elevator 115, a lower end of the manifold 209 is opened, and the processed wafers 200 are unloaded from the lower end of the manifold 209 to an outside of the process tube 205 while being held by the boat 217 (boat unloading). Thereafter, the processed wafers 200 are taken out of the boat 217 (wafer discharge).

Through the above steps, a ZrO film is formed on each of the wafers 200.

According to the present embodiment, the flow velocity of the mixed gas on each of the wafers 200 at the time of supplying the TEMAZ gas is increased by increasing the flow rate of the $N_2$ gas at the time of supplying the TEMAZ gas, and step coverage performance can be improved by reducing the partial pressure of the TEMAZ gas in the mixed gas. That is, by increasing the flow rate of the $N_2$ gas at the time of supplying the Zr-containing gas which is a source gas, and changing the flow velocity and the partial pressure, while the gas is sufficiently supplied to a lower portion of each of the wafers 200 having a pattern on a surface thereof, supply of a processing gas to a surface (upper portion) of each of the wafers 200 is suppressed, and step coverage performance can be improved.

Hereinafter, Modified Examples of the present embodiment will be described.

Modified Example 1

Figure 6:
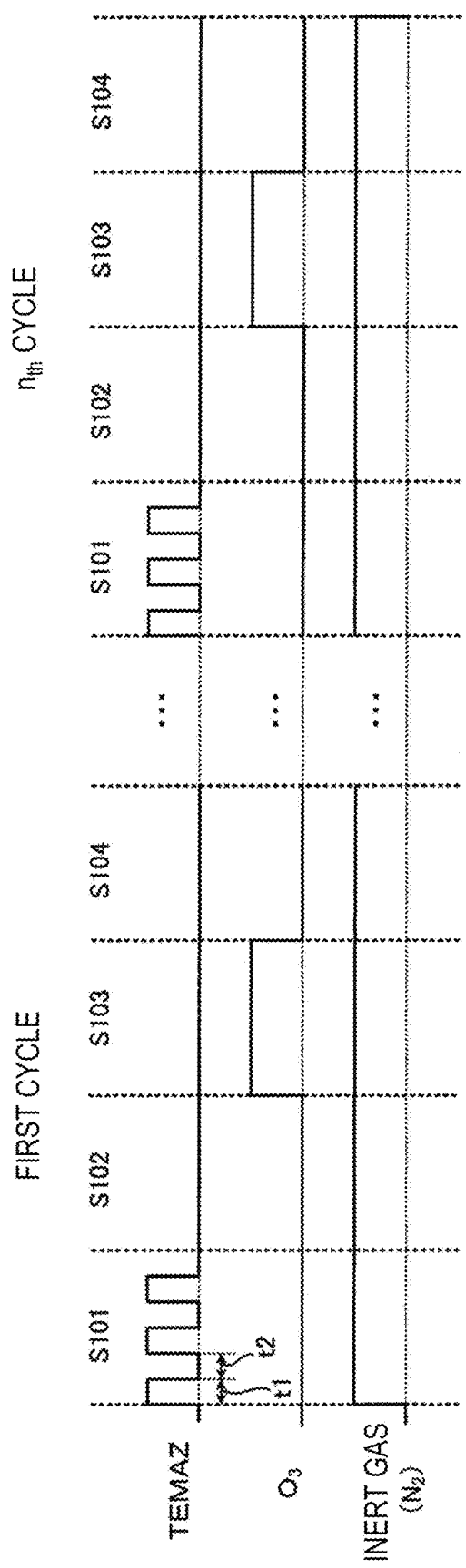
FIG. 6 is a diagram illustrating a modified example of a timing chart for explaining an example of a process of manufacturing a zirconium oxide film using a substrate processing apparatus according to a preferable embodiment of this present disclosure.

In FIG. 6, in the source gas supply step (TEMAZ gas supply step) in step S101, the TEMAZ gas as a source gas is dividedly supplied.

Specifically, the TEMAZ gas is dividedly (intermittently) supplied into the process chamber 201 at least from the second cycle. That is, the TEMAZ gas which is a source gas is supplied in a plurality of steps. A step of gas supply t1 is performed a plurality of times, and gas stop t2 is performed between the steps of gas supply t1. In other words, when the TEMAZ gas is supplied, gas stop t2 to temporarily stop (interrupt) supply of the TEMAZ gas is performed. In other words, the TEMAZ gas is intermittently supplied. During this gas stop t2, only vacuum-exhaust may be performed, only purge may be performed, or both vacuum-exhaust and purge may be performed. As described above, by performing gas supply t1 and gas stop t2, a by-product generated in gas supply t1 can be removed in gas stop t2. The by-product physically or chemically interferes with a reaction (main reaction) between a source gas and an oxygen-containing gas, and lowers a probability of occurrence of the main reaction. Interference with the main reaction is caused by a decrease in the partial pressure of the source gas or the oxygen-containing gas due to an increase in the partial pressure of the by-product, or by adhesion of the by-product to an adsorption site on a substrate surface.

Partial supply of the source gas is preferably performed at least from the second cycle. As illustrated in FIG. 6, before supply of the source gas in the first cycle, there is a case where no oxygen-containing gas is supplied and no by-product is generated. In such a case where no by-product is generated, in the first cycle, the source gas may be supplied without being divided.

Modified Example 2

Figure 7:
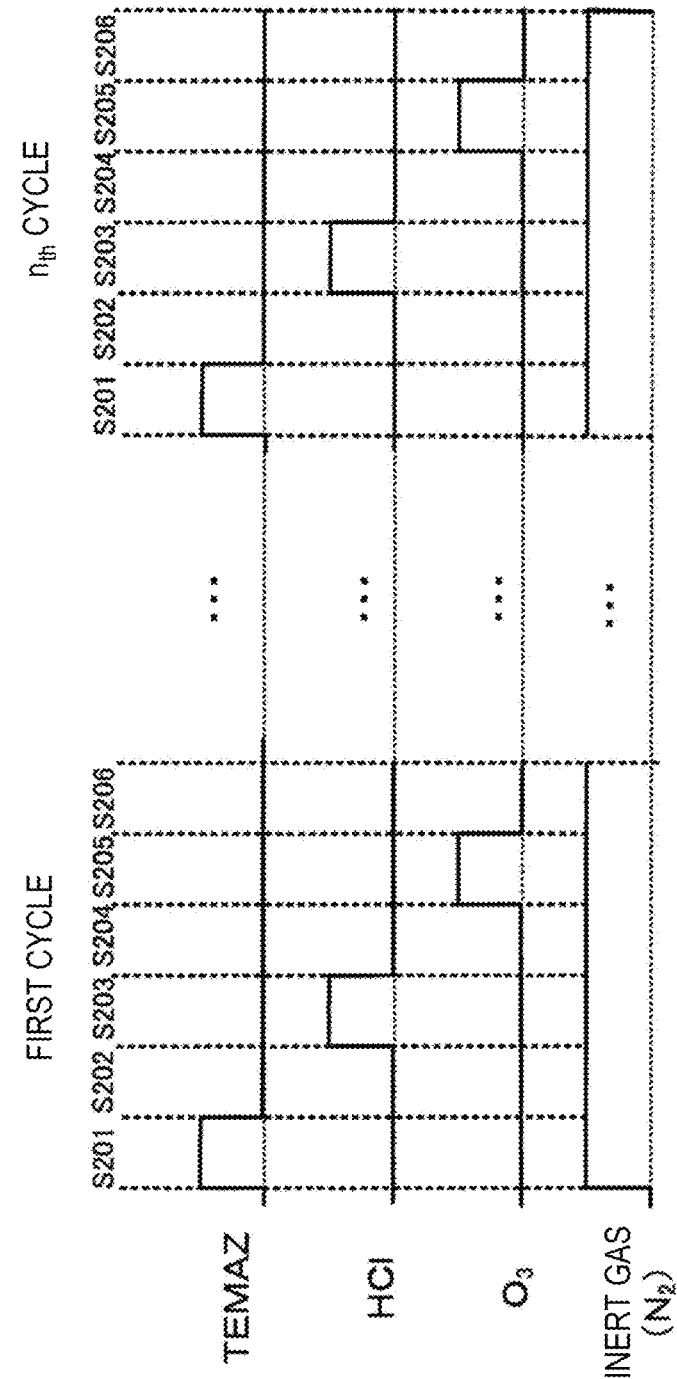
FIG. 7 is a diagram illustrating a modified example of a timing chart for explaining an example of a process of manufacturing a zirconium oxide film using a substrate processing apparatus according to a preferable embodiment of this present disclosure.

In FIG. 7, between a source gas supply step (TEMAZ gas supply step, step S201 in FIG. 7) in step S101 and an oxygen-containing gas supply step ($O_3$ gas supply step, step S205 in FIG. 7) in step S103, an etching gas supply step (HCl gas supply step, step S203 in FIG. 7) for supplying a hydrochloric acid (HCl) gas as an etching gas is provided.

Specifically, by performing the above-described TEMAZ gas supply step (FIG. 7, step S201), removal of a residual gas (FIG. 7, step S202), the HCl gas supply step for supplying a small amount of HCl gas (FIG. 7, step S203), removal of a residual gas (FIG. 7, step S204), the $O_3$ gas supply step (FIG. 7, step S205), and removal of a residual gas (FIG. 7, step S206), and by performing a cycle including steps S201 to S206 n times, a ZrO film is formed on each of the wafers 200. By supplying a small amount of HCl gas after a Zr-containing gas is supplied, a film adhering to an upper surface of each of the wafers 200 is etched. The HCl gas is supplied from the same nozzle 249d as the TEMAZ gas.

The etching gas is a chlorine-based gas as a cleaning gas, and a chlorine ($Cl_2$) gas, a boron trichloride ($BCl_3$) gas, or the like can be used as the etching gas in addition to the HCl gas.

Example

Figure 8:
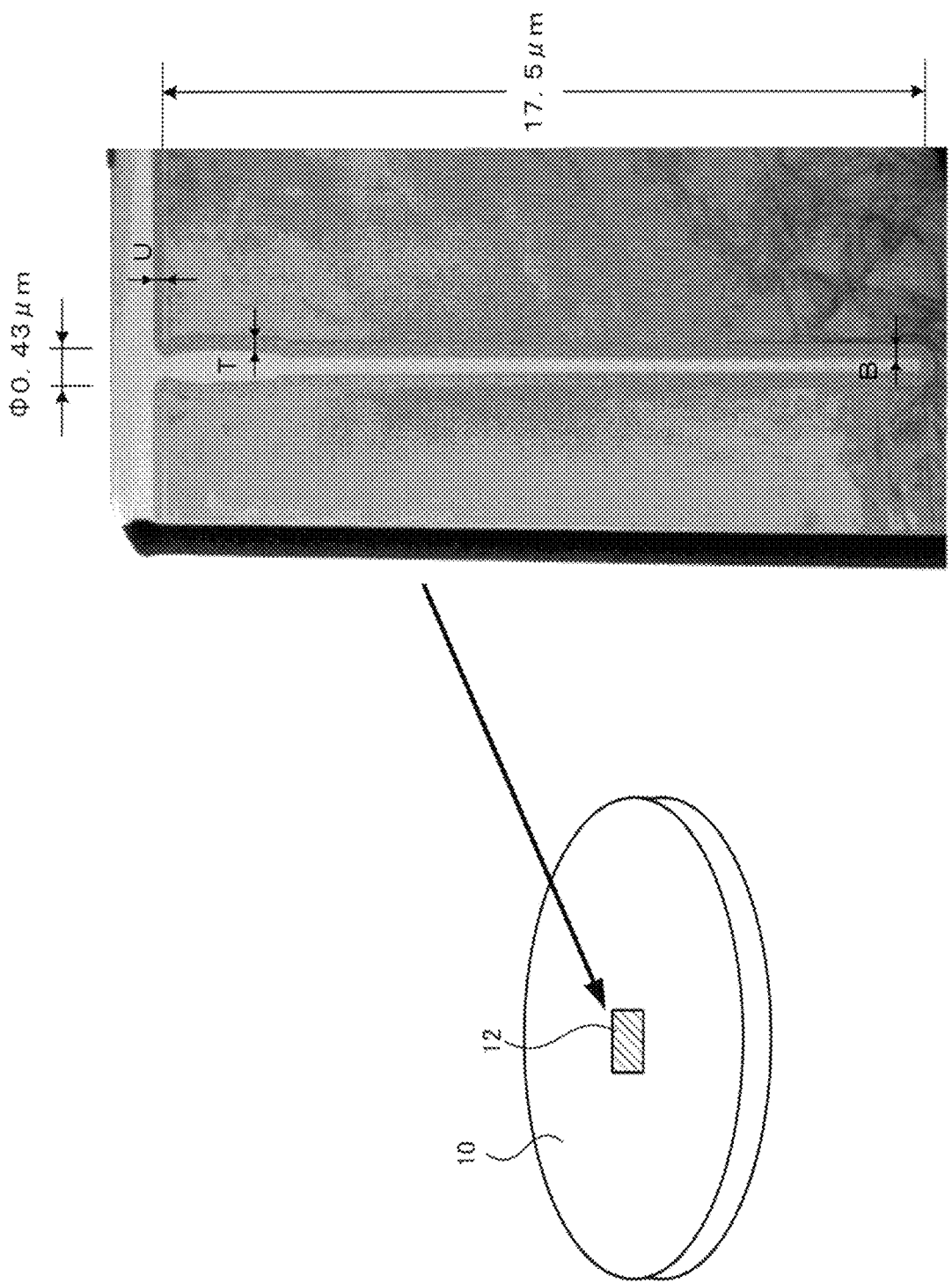
FIG. 8 is a diagram illustrating an example of a hole pattern.

Evaluation was performed in order to confirm an effect of improving step coverage by changing a flow velocity at the time of supplying a source gas. In the present Example, a test chip 12 having a groove depth of 17.0 to 18.0 μm and a groove diameter of 0.40 to 0.50 μm was disposed in a central portion of a pattern substrate jig 10 having a surface area 23 times a substrate on which no pattern was formed, a ZrO film was formed, and a cross section was observed. FIG. 8 is a diagram illustrating an example of a hole pattern used in this evaluation.

Figure 5:
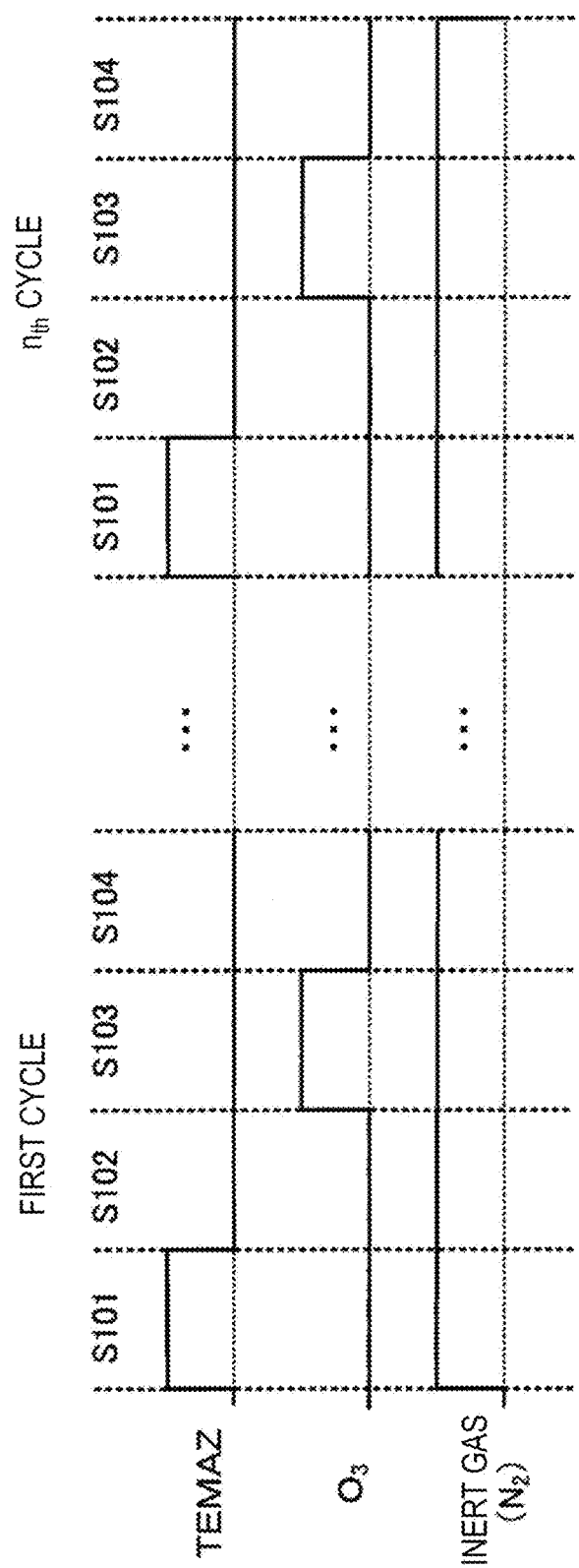
FIG. 5 is a timing chart for explaining an example of a process of manufacturing a zirconium oxide film using a substrate processing apparatus according to a preferable embodiment of this present disclosure.

In the present Example, a ZrO film was formed on the test chip 12 according to the apparatus configuration in the above-described embodiment and the gas supply timing in FIG. 5. Specifically, at the time of supplying the TEMAZ gas in FIG. 5 described above, film formation was performed while a flow velocity of the mixed gas was 10.5 to 11.5 m/s, an $N_2$ gas flow rate was 39.6 to 43.3 slm, and a TEMAZ gas partial pressure in the mixed gas was 0.209 to 0.228. As Comparative Example, at the time of supplying the TEMAZ gas onto another test chip 12, film formation was performed while a flow velocity of the mixed gas was 3.5 to 4.5 m/s, an $N_2$ gas flow rate was 14.4 to 18.5 slm, and a TEMAZ gas partial pressure in the mixed gas was 0.5 to 0.64. In order to observe a change depending on the flow velocity, the conditions other than the flow velocity, the $N_2$ gas flow rate, and the Zr concentration (partial pressure) were the same.

Figure 9:
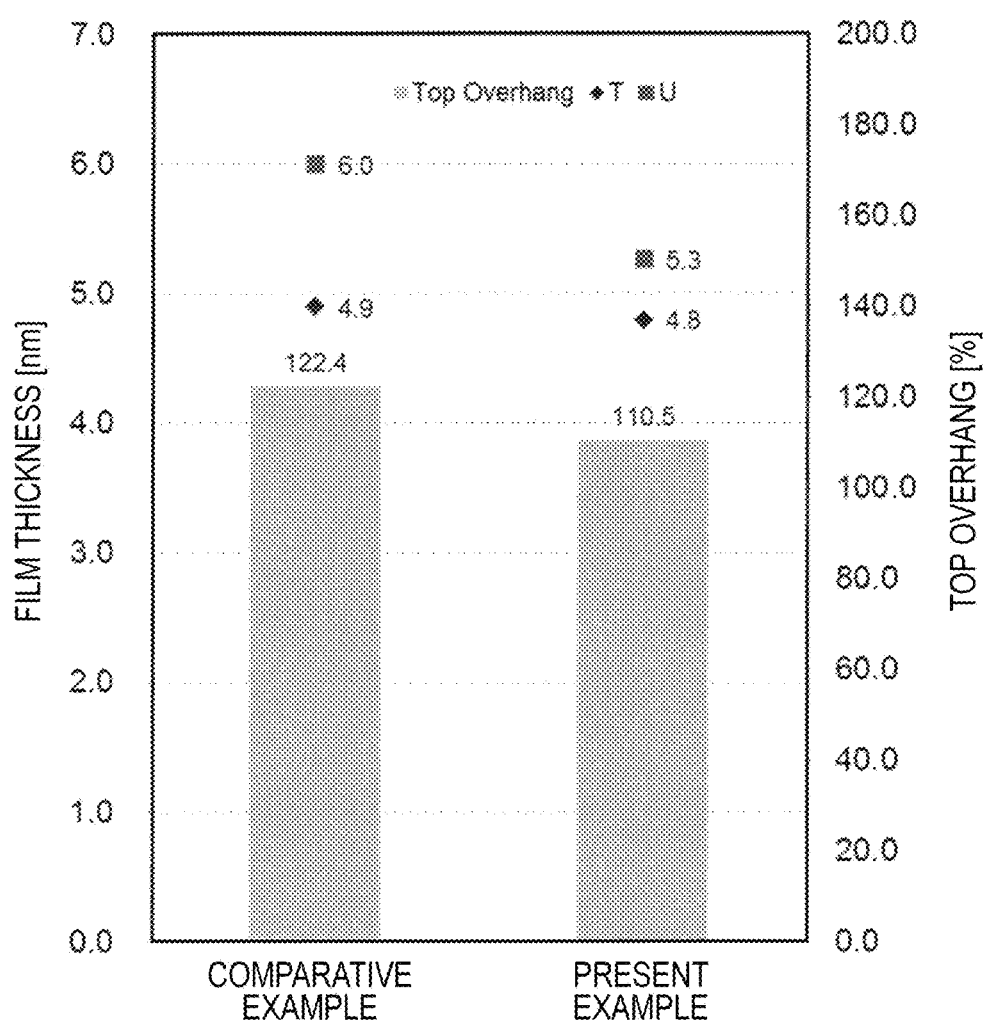
FIG. 9 is a diagram illustrating comparison in top overhang between a zirconium oxide film formed in the present Example and a zirconium oxide film formed in Comparative Example.
Figure 10:
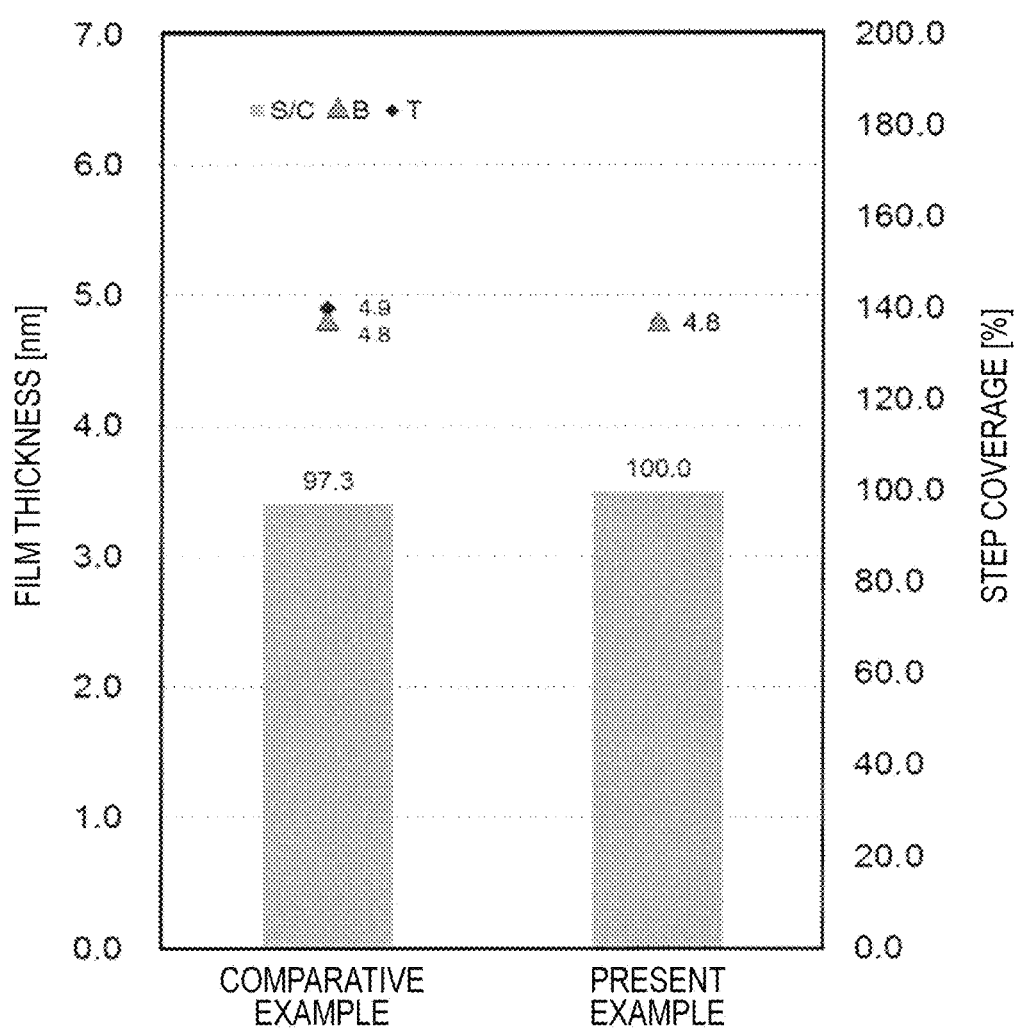
FIG. 10 is a diagram illustrating comparison in step coverage between a zirconium oxide film formed in the present Example and a zirconium oxide film formed in Comparative Example.

FIG. 9 is a diagram illustrating comparison in top overhang between a ZrO film formed in the present Example and a ZrO film formed in Comparative Example. FIG. 10 is a diagram illustrating comparison in step coverage between the ZrO film formed in the present Example and the ZrO film formed in Comparative Example. In each of the ZrO films, a film thickness U formed on the uppermost portion of the test chip 12, a film thickness T formed on an upper side surface of a groove portion, and a film thickness B formed on a lower side surface of the groove portion were measured, and top overhang was calculated by U/T×100(%). Step coverage was calculated by B/T×100(%).

As illustrated in FIGS. 9 and 10, in the ZrO film formed in Comparative Example, the film thickness U was 6.0 nm, the film thickness T was 4.9 nm, the film thickness B was 4.8 nm, top overhang was 122.4%, and step coverage was 97.3%. Meanwhile, in the ZrO film formed in the present Example, the film thickness U was 5.3 nm, the film thickness T was 4.8 nm, the film thickness B was 4.8 nm, top overhang was 110.5%, and step coverage was 100.0%. That is, in the present Example, a value of top overhang was smaller than that in Comparative Example, a value of step coverage was larger than that in Comparative Example, and reached an ideal value of 100%. That is, improvement in both top overhang and step coverage was observed.

This indicates that it is important to raise a flow velocity to make Zr molecules reach a lower portion of each of the wafers 200 more quickly because molecules in the test chip 12 dominantly cause diffusion but Zr has a large molecular weight and has a slow diffusion rate. In addition, it is considered that excessive supply to an upper portion of the test chip 12 could be suppressed by a decrease in partial pressure of the source gas in the mixed gas due to an increase in a flow rate of the $N_2$ gas.

That is, by changing the flow rate of the $N_2$ gas at the time of supplying the source gas, increasing the flow velocity of the mixed gas on a wafer at the time of supplying the source gas, and decreasing the partial pressure of the source gas in the mixed gas, while the gas is sufficiently supplied to a lower portion of a device, supply of a processing gas to an upper portion of the device is suppressed, and step coverage performance can be improved. Furthermore, at the time of supplying the source gas, by changing the flow rate of the $N_2$ gas, it has been confirmed that the flow velocity of the mixed gas on the wafer is preferably set to about 7.8 to 15.6 m/s, and the partial pressure of the source gas in the mixed gas is preferably set to 0.167 to 0.3.

The above-described embodiment, Modified Examples, application examples, and the like can be combined to each other appropriately to be used. Furthermore, this present disclosure is not limited to the above-described embodiment, and various modifications can be made within a range not departing from the gist thereof.

In the above-described embodiment, an example in which a film is formed using a substrate processing apparatus which is a batch-type vertical apparatus for processing a plurality of substrates at a time has been described. However, this present disclosure is not limited thereto, and can be suitably applied also to a case of forming a film using a single wafer type substrate processing apparatus for processing one or several substrates at a time. In addition, in the above-described embodiment, an example in which a film is formed using a substrate processing apparatus including a hot-wall type process furnace has been described. However, this present disclosure is not limited thereto, and can be suitably applied also to a case of forming a film using a substrate processing apparatus including a cold-wall type process furnace.

In addition, in the above-described embodiment, description has been made using the TEMAZ gas which is a Zr-containing gas as an organic source gas. However, this present disclosure is not limited thereto, and tetrakisdiethylaminozirconium ($Zr[N(C_2H_5)_2]_4$), tetrakisdimethylamino zirconium ($Zr[N(CH_3)_2]_4$), trisdimethylaminocyclopentadienyl zirconium ($(C_5H_5)Zr[N(CH_3)_2]_3$), and the like can be suitably applied. Furthermore, this present disclosure is also effective for use of an organic material other than the Zr-containing gas. For example, tetrakisethylmethylamino hafnium (TEMAH, $Hf[N(CH_3)C_2H_5]_4$), tetrakisdiethylamino hafnium ($Hf[N(C_2H_5)_2]_4$), tetrakisdimethylamino hafnium ($Hf[N(CH_3)_2]_4$), and trisdimethylaminocyclopentadienyl hafnium ($(C_5H_5)Hf[N(CH_3)_2]_3$) which are hafnium-containing gases that can be suitably applied. One of reasons why this present disclosure is suitable for an organic source is that the organic source includes more ligands than an inorganic source, and therefore has a larger molecular weight.

In addition, in the above-described embodiment, an example in which an oxide film is formed using an $O_3$ gas which is an oxidizing gas as an oxygen-containing gas has been described. However, this present disclosure is not limited thereto, and an oxidizing gas such as oxygen ($O_2$), water vapor ($H_2O$), hydrogen peroxide ($H_2O_2$), or nitrous oxide ($N_2O$) can be suitably applied.

In addition, this present disclosure is also applicable to a film type other than the ZrO film as long as the film type uses an organic material. For example, a hafnium oxide film (HfO film) or a composite film of a ZrO film and an HfO film can be formed using the above-described sources.

As the inert gas, in addition to the $N_2$ gas, a rare gas such as an Ar gas, a He gas, a Ne gas, or a Xe gas may be used.

In the above-described embodiment, the configuration in which one nozzle for supplying the TEMAZ gas which is an organic source gas into the process chamber 201 is used has been described. However, this present disclosure is not limited thereto, but can be also applied to a configuration in which a plurality of nozzles having different heights is disposed.

In addition, in the above-described embodiment, an example in which one nozzle for supplying the TEMAZ gas which is an organic material gas into the process chamber 201, two nozzles for supplying the $O_3$ gas which is an oxygen-containing gas, and two nozzles for supplying the $N_2$ gas which is an inert gas are used has been described. However, this present disclosure is not limited thereto, but may be modified appropriately.

According to this present disclosure, it is possible to improve step coverage performance of a film formed on a substrate.

What is claimed is:

1. A method for manufacturing a semiconductor device to form a metal oxide film on a substrate, comprising:
   sequentially performing, a cycle a plurality of times, wherein the cycle includes:
   (a) supplying a mixed gas of an organic metal-containing source gas and an inert gas to a process chamber housing the substrate by adjusting a flow velocity of the mixed gas on the substrate to 7.8 m/s to 15.6 m/s and adjusting a partial pressure of the organic metal-containing source gas in the mixed gas to 0.167 to 0.3;
   (b) exhausting the process chamber,
   (c) supplying a chlorine-containing gas to the process chamber,
   (d) supplying an oxygen-containing gas to the process chamber, and
   (e) exhausting the process chamber.

2. The method for manufacturing the semiconductor device according to claim 1, wherein the organic metal-containing source gas is supplied in a plurality of steps in the (a) of at least one cycle among the plurality of times the cycle is performed.

3. The method for manufacturing the semiconductor device according to claim 2, wherein the organic metal-containing source gas is supplied dividedly at least from a second cycle among the plurality of times the cycle is performed.

4. The method for manufacturing the semiconductor device according to claim 1, wherein the organic metal-containing source gas is an organic zirconium-containing source gas or an organic hafnium-containing source gas.

5. The method for manufacturing the semiconductor device according to claim 4, wherein the organic metal-containing source gas, the inert gas, and the oxygen-containing gas are supplied so as to flow in a direction horizontal to a surface of the substrate.

* * * * *